(12) United States Patent
Horine

(10) Patent No.: US 6,248,151 B1
(45) Date of Patent: Jun. 19, 2001

(54) METHOD OF MANUFACTURING THREE DIMENSIONAL PARTS USING AN INERT GAS

(75) Inventor: David A. Horine, Los Altos, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/302,929

(22) Filed: Apr. 30, 1999

Related U.S. Application Data

(63) Continuation-in-part of application No. 08/977,814, filed on Nov. 25, 1997, now abandoned.

(51) Int. Cl.$^7$ .................................................. B05D 1/02
(52) U.S. Cl. .............................. 75/335; 75/345; 427/565; 427/600
(58) Field of Search ...................... 75/335, 345; 427/565, 427/600

(56) References Cited

U.S. PATENT DOCUMENTS 6,007,183 * 12/1999 Horine .................... 75/335
6,019,814 * 2/2000 Horine .................... 75/335

* cited by examiner

Primary Examiner—George Wyszomierski
(74) Attorney, Agent, or Firm—Nola Mae McBain

(57) ABSTRACT

A method for manufacturing metal structures in which minute drops of a liquid metal are emitted from an acoustic device through an inert gas. The presence of the inert gas at the surface of the liquid metal prevent the formation of an oxide skin which would absorb acoustic energy and hinder droplet formation and emission. The droplets are then emitted towards a substrate, which may form as a carrier, where they may be used to form solder bumps, circuit traces, or accepted to form a three dimensional device.

12 Claims, 3 Drawing Sheets

METHOD OF MANUFACTURING THREE DIMENSIONAL PARTS USING AN INERT GAS

This application is a continuation-in-part of application(s) Ser. No(s). 08/977,814, filed Nov. 25, 1997, now abandoned

INCORPORATION BY REFERENCE

The following U.S. patents are fully incorporated by reference:

U.S. Pat. No. 4,308,547 titled "Liquid Drop Emitter" by Lovelady et al., issued Dec. 29,1981, U.S. Pat. No. 4,697,195 titled "Nozzleless Liquid Droplet Ejectors", by Quate et al., issued September 29,1987, U.S. Pat. No. 5,041,849 titled "Multi-Discrete-Phase Fresnel Acoustic Lenses And Their Application To Acoustic Ink Printing" by Quate et al., issued Aug. 20, 1991, U.S. Pat. No. 5,121,141 titled "Acoustic Ink Printhead With Integrated Liquid Level Control Layer" to Hadimioglu et al., issued Jun. 9, 1992, U.S. Pat. No. 5,608,433 titled "Fluid Application Device And Method Of Operation" by Quate, issued Mar. 4, 1997, U.S. Pat. No. 5,591,490 titled "Acoustic Deposition Of Material Layers" by Quate, issued Jan. 7, 1997, U.S. Pat. No. 5,565,113 titled "Lithographically Defined Ejection Units" by Hadimioglu et al., issued Oct. 15, 1996, and, U.S. Pat. No. 5,520,715 titled "Directional Electrostatic Accretion Process Employing Acoustic Droplet Formation" by Oeftering, issued May 28, 1996.

BACKGROUND

The present invention is directed to a method and apparatus for manufacturing three dimensional products. Some of the familiar prior art techniques for creating such products include, casting, extrusion, stereolithography and powder metallurgy. After the initial product is formed in the prior art, forming techniques, extractive techniques, chemical etching and additive or deposition techniques are often also performed to bring the product to final form.

Casting is usually performed by pouring a liquid, such as molten metal or plastic, into a mold and letting it cool and solidify. The metal takes the shape of the mold's interior surface as it solidifies. In extrusion, semi-molten, molten plastic, or hot metal is forced through an extrusion die which has a predetermined two dimensional shape. The extruded material takes the shape of the die and the shape of the die is transferred to the product through contact. In powdered metallurgy, a batch of solid metal particles or powder is introduced into a mold where high temperature and pressure are applied to fuse or sinter the particles together. As is the case with casting, the end product assumes the shape of the mold's interior surface. In stereolithography, an object is made by solidifying superposed layers of curable plastic resin until the complete object is built up.

After these initial objects are produced, forming techniques, extractive techniques, chemical etching, and additive or depositive techniques are often used to bring the product to the final form. Additional manufacturing techniques for making such objects include creating the products out of preformed component parts which are then joined by welding, soldering or brazing, or gluing.

However, many of these techniques have disadvantages. The molded form technique requires the mold be manufactured before the intended end product can be produced. In extractive techniques, much of the material is discarded causing waste of production materials. Metal fabrication by welding, soldering and brazing requires that the component parts be preformed before the final joining operation. In stereolithography, individual layers may change their volume when solidifying, causing stresses and deformation in the resultant product and materials are limited to a few plastic resins. In addition, the specialized facilities needed for manufacturing are bulky and expensive.

A directional electrostatic accretion process employing acoustic droplet formation has been described in U.S. Pat. No. 5,520,715 by Oeftering, issued May 28, 1996, which addresses some of these issues. The process uses acoustically formed charged droplets of molten metal which are controlled by an acceleration electrode and deflection plates to build up a three dimensional product on a target substrate. The system is precisely controlled by a design workstation which has the parameters of the product to be built to insure the accuracy of the trajectory of each charged droplet. This process is certainly an improvement over prior processes because it requires less equipment that need not be retooled for every product desired to be reproduced, but it is limited in use because it must be operated in a vacuum or oxygen free atmosphere to eliminate the formation of an oxide skin on the free surface of the liquid metal. Formation of an oxide skin can impede ejection of metal droplets and absorb acoustic energy.

An oxygen free atmosphere can be created two ways, either operating in the vacuum of space or by enclosing the entire apparatus. Enclosing the apparatus requires additional large and complex machinery. Additionally, maintaining a precise depth of the pool of molten metal when the device is placed in a vacuum requires additional process steps not necessary when such a device is used in an atmospheric environment. Conventional displacement devices have been shown to be unreliable when used in a vacuum unopposed by some external pressure means. Therefore the pool depth must be monitored and regulated using displacement means or an acoustic radiation pump.

It would therefore be desirable to build a manufacturing device, which requires fewer bulky parts, does not require retooling for each new part, and which is capable of building three dimensional parts out of molten metal but which does not require the apparatus to be operated in a vacuum or an oxygen free atmosphere.

Further advantages of the invention will become apparent as the following description proceeds.

SUMMARY OF THE INVENTION

A method for manufacturing metal structures in which minute drops of a liquid metal are emitted from an acoustic device through an inert gas. The presence of the inert gas at the surface of the liquid metal prevent the formation of an oxide skin which would absorb acoustic energy and hinder droplet formation, emission and aggregation. The droplets are then emitted towards a substrate, which may form as a carrier, where they may be used to form solder bumps, circuit traces, or accepted to form a three dimensional device.

Figure 1:
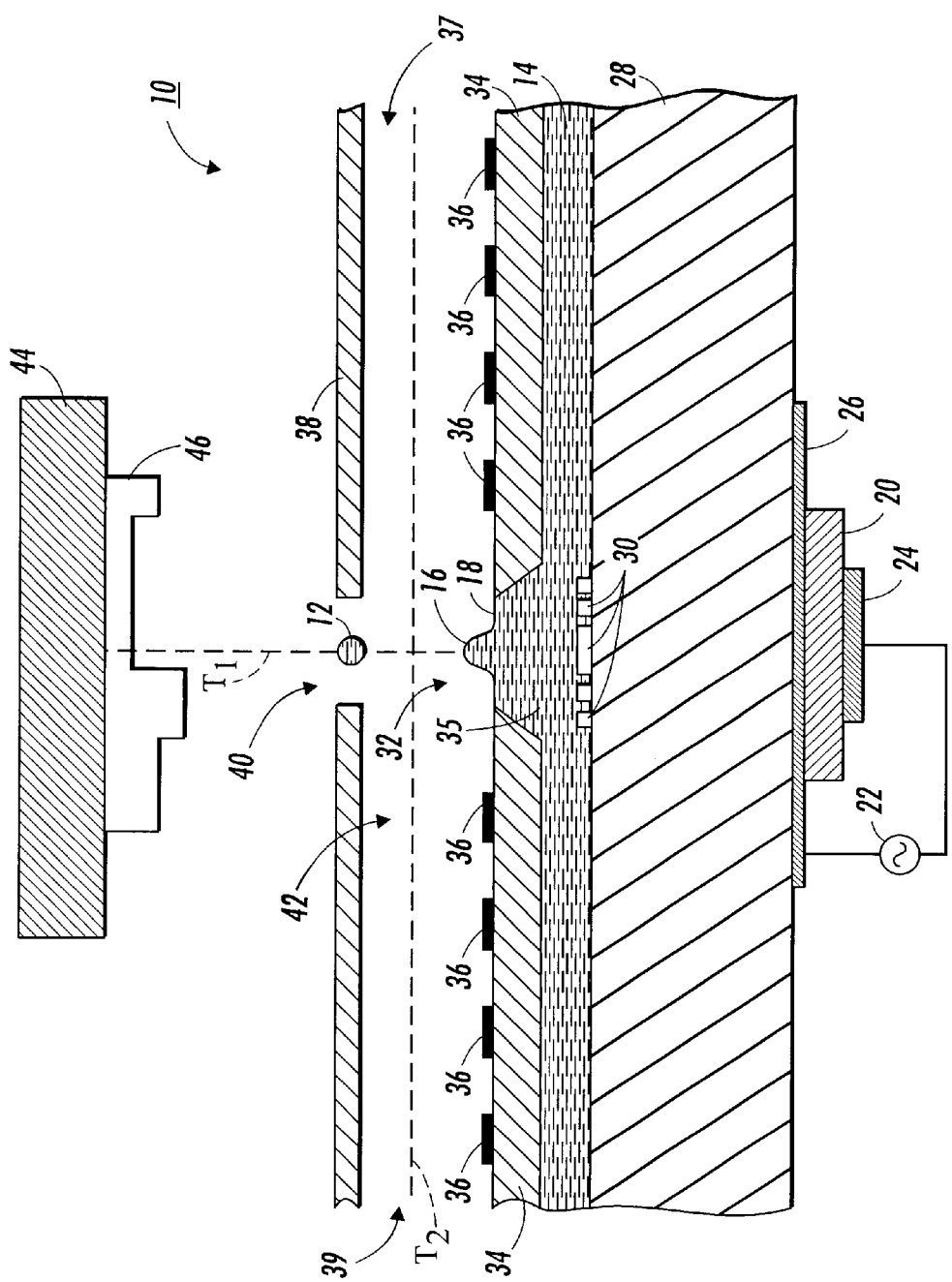
FIG. 1 shows a cross sectional view of a device which generates liquid droplets using focused acoustic energy according to the present invention.

While the present invention will be described in connection with a preferred embodiment and method of use, it will be understood that it is not intended to limit the invention to that embodiment and procedures. On the contrary, it is intended to cover all alternatives, modifications and equivalents as may be included within the spirit and scope of the invention as defined by the appended claims.

ALPHA NUMERIC LIST OF ELEMENTS

T1 droplet trajectory
T2 inert gas trajectory
10 droplet emitter
12 droplet
14 liquid metal
16 mound
18 free surface of liquid
20 transducer
22 RF source
24 bottom electrode
26 top electrode
28 base
30 acoustic lens
32 opening
34 top fluid containment plate
35 pool
36 heaters
37 inlet
38 top gas containment plate
39 outlet
40 opening
42 inert gas
44 substrate
46 solid structure
48 circuit board or electronic part
50 solder bumps
52 gas inlet manifold
54 gas inlet tube
56 gas outlet manifold
58 gas outlet tube

DETAILED DESCRIPTION OF THE INVENTION

Turning now to FIG. 1 a device which generates liquid droplets using focused acoustic energy is shown. Such devices are known in the art for use in printing applications. Detailed descriptions of acoustic droplet formation and acoustic printing can be found in the following U.S. patent applications Ser. No. 4,308,547 titled "Liquid Drop Emitter" by Lovelady et al., issued Dec. 29, 1981; U.S. Pat. No. 4,697,195 titled "Nozzleless Liquid Droplet Ejectors", by Quate et al., issued Sep. 29, 1987; U.S. Pat. No. 5,041,849 titled "Multi-Discrete-Phase Fresnel Acoustic Lenses And Their Application To Acoustic Ink Printing" by Quate et al., issued Aug. 20, 1991; U.S. Pat. No. 5,121,141 titled "Acoustic Ink Printhead With Integrated Liquid Level Control Layer" by Hadimioglu et al., issued Jun. 9, 1992; U.S. Pat. No. 5,608,433 titled "Fluid Application Device And Method Of Operation" by Quate issued Mar. 4, 1997, all herein incorporated by reference, as well as other patents.

The most important feature of the device shown in FIG. 1 is that it does not use nozzles and is therefore unlikely to clog, especially when compared to other methods of forming and ejecting small, controlled droplets. The device can be manufactured using photolithographic techniques to provide groups of densely packed emitters each of which can eject carefully controlled droplets. Furthermore, it is known that such devices can eject a wide variety of materials. U.S. Pat. No. 5,591,490 titled "Acoustic Deposition Of Material Layers" by Quate issued Jan. 7, 1997, and herein incorporated by reference, describes a method for using an array of such acoustic droplet emitters to form a uniform layer of resist. U.S. Pat. No. 5,565,113 titled "Lithographically Defined Ejection Units" by Hadimioglu et al., issued Oct. 15, 1996, and herein incorporated by reference, states that the principles of acoustic printing are suitable for ejection of materials other than marking fluids, such as mylar catalysts, molten solder, hot melt waxes, color filter materials, resists, chemical compounds, and biological compounds. U.S. Pat. No. 5,520,715 titled "Directional Electrostatic Accretion Process Employing Acoustic Droplet Formation" by Oeftering issued May 28, 1996, and herein incorporated by reference, describes using focused acoustic energy to emit droplets of liquid metal.

With the above concepts firmly in mind, the operation of an exemplary acoustic droplet emitter, according to the present invention, will now be described. There are many variations in acoustic droplet emitters and the description of a particular droplet emitter is not intended to limit the disclosure but to merely provide an example from which the principles of acoustic droplet generation in this inventions particular context can be understood.

FIG. 1 shows an acoustic droplet emitter 10 shortly after emission of a droplet 12 of a liquid metal 14 and before a mound 16 on a free surface 18 of the liquid metal 14 has relaxed. The forming of the mound 16 and the subsequent ejection of the droplet 12 is the result of pressure exerted by acoustic forces created by a ZnO transducer 20. To generate the acoustic pressure, RF energy is applied to the ZnO transducer 20 from an RF source via a bottom electrode 24 and a top electrode 26. The acoustic energy from the transducer 20 passes through a base 28 into an acoustic lens 30. The acoustic lens 30 focuses its received acoustic energy into a small focal area which is at or very near the free surface 18 of the liquid metal 14. Provided the energy of the acoustic beam is sufficient and properly focused relative to the free surface 18 of the liquid 14, a mound 16 is formed and a droplet 12 is subsequently emitted on a trajectory $T_1$.

The liquid metal 14 is contained by a top plate 34 which has a opening 32 in which the free surface 18 of the liquid 14 is present and from which the droplet 12 is emitted. The liquid 14 metal flows beneath the top fluid containment plate 34 and past the acoustic lens 30 without disturbing the free surface 18 and creating a pool 35 having a free surface 18 in the immediate vicinity of the opening 32 in the top fluid containment plate 34. Heaters 36 are provided in the top fluid containment plate to insure proper temperature control and liquidity of the liquid metal 14. The heaters 36 can be provided by any of the known techniques for making heaters on silicon substrates. One such method would be to sputter Nichrome, a nickel and chromium alloy onto a top fluid containment plate constructed from a heat stable, electrically inactive material, such as undoped silicon, silicon with thin silicon dioxide layer or ceramic. Standard photolithography, as known in the art, can then be used to form the individual heaters from the sputtered Nichrome.

The opening 32, in the top fluid containment plate 34, is many times larger than the drop 12 which is emitted thereby greatly reducing clogging of the opening, especially as compared to other droplet ejection technologies. It is this feature of the droplet emitter 10 which makes its use desirable for emitting droplets of a wide variety of materials. Also important to the invention is the fact that droplet size of acoustically generated and emitted droplets can be precisely controlled. Drop diameters can be as small as 16 microns allowing for the deposition of very small amounts of material, and resolutions of features as small as 600 dpi. These features of the droplet emitter allow for the very precise construction of items as well as the construction of very small items.

Also present in the droplet emitter 10 is a top gas containment plate 38 with an opening 40 which is aligned with the opening 32 in the top fluid containment plate 34. Opening 40 in the top gas containment plate 38 need not be as large as opening 32 in the top fluid containment plate. Opening 40 in the top gas containment plate 38 need only be large enough for the emitted droplet 12 to pass through unobstructed. A continuously flowing inert gas 42 flows through the space created between the top fluid containment plate 34 and the top gas containment plate 38 entering through inlet 37, flowing along trajectory $T_2$ past the free surface 18 and out through outlet 39. The inert gas 42 needs only to flow with some positive pressure.

It is desirable to keep the flow rate as low as possible to avoid disturbing the trajectory $T_1$ of the emitted droplet 12 at approximately 4 m/sec. Flow rates of approximately 0.5 m/sec or less should be sufficient to provide a continuous flow of inert gas 42 without disturbing the trajectory T of the emitted droplet 12. By inert gas, what is meant is a gas that will not react with the free surface 18 of the liquid metal 14. Examples of such gasses include argon, zenon, krypton or nitrogen, although any such gas is appropriate. If the inert gas 42 were not present, then oxygen in the atmosphere would react with the free surface 18 of the liquid to form an oxide skin which would absorb acoustic energy and impede the emission of droplets 12 from the droplet emitter 10. The mound 16 and the droplet 12 are formed in the presence of the inert gas 42. The droplet 12 is then emitted through the opening 40 in the top gas containment plate 38 along the trajectory $T_1$ towards the substrate 44, forming a solid structure 46 on the substrate 44.

It should be noted that the inert gas 42 will bleed slightly through the opening 40 in the top gas containment plate 42. If the substrate 44 is placed in close proximity to the droplet emitter 10, then the gap between the substrate 44 and the droplet emitter 10 should be at least partially filled with inert gas 42 due to the bleeding of the inert gas 42 though the opening 40 in the top gas containment plate 38. The maximum recommended distance between the droplet emitter 10 and the substrate 44 or the surface of the solid structure 46 is approximately 1 mm. However, while there will be some bleeding of the inert gas 42, the largest portion, or the majority of the gas should flow through the plenum created by the top fluid containment plate 34 and the top gas containment plate 38.

The solid structure 46 is built up in three dimensions by emitting successive layers of droplets 12. This can be accomplished by either moving the substrate 44 while maintaining droplet emitter 10 as fixed, moving droplet emitter 10 while maintaining the substrate 44 as fixed or moving both substrate 44 and droplet emitter 10. As the layers build up to form solid structure 46, it may be necessary to adjust the positioning of the substrate 44 to provide more distance between the substrate 44 and the droplet emitter 10. This is to compensate for build-up of solid structure 46 and maintain a preferred distance between the droplet emitter 10 and either substrate 44 or solid structure 46. Again this can be accomplished by either moving the substrate 44 while maintaining droplet emitter 10 as fixed, moving droplet emitter 10 while maintaining the substrate 44 as fixed or moving both substrate 44 and droplet emitter 10.

While a variety of liquefied metals might be used, one example particularly suited for this process is any of the varieties of solder. For example, a solder made up of 63% tin and 37% lead has a melting point of only 183 degrees centigrade. The low melting points of solders makes them especially suited for this type of application.

In practice, the individual droplet emission of liquid metals can be used in various applications. Shown in FIG. 1, is the application of building three dimensional metal structures. The structure can either be formed from the desired metal needed for a particular part or formed from a metal that has a low melting point, such as the solders mentioned above, and used as an investment casting for high melting point alloys. The advantage to making investment castings from this process is that investment castings with very fine details can be made due to the small droplet size, about 16 microns in diameter, obtainable with this process.

Figure 2:
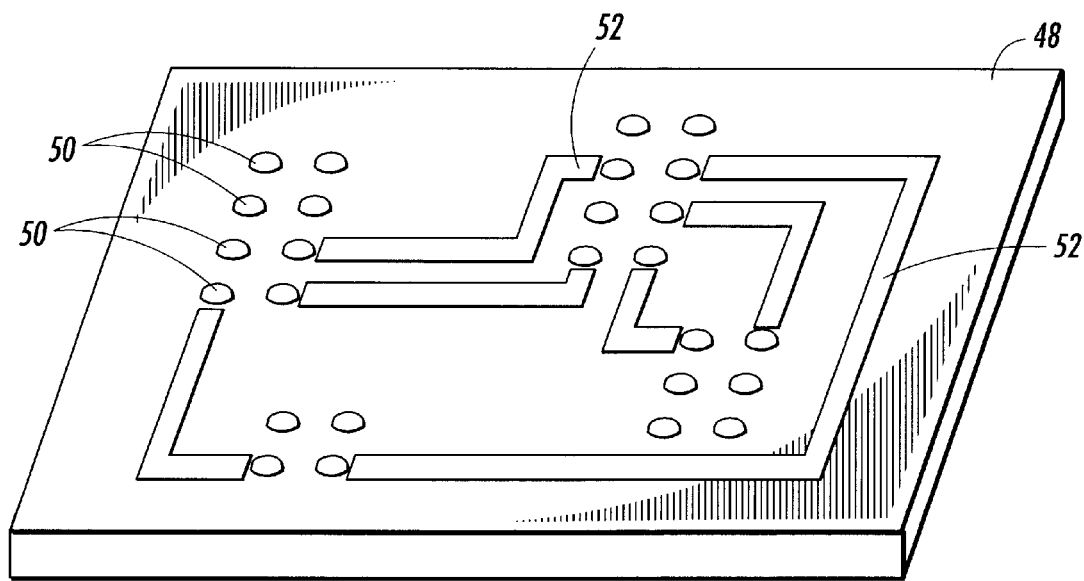
FIG. 2 shows a perspective view of a product made using the present invention.

An alternative product is shown in FIG. 2. FIG. 2 is a perspective view of a circuit board or electronic part 48 which has a plurality of solder bumps 50. Solder bumps are often used as a means of joining integrated circuits to substrates. The droplet emitter 10 shown in FIG. 1 has the unique ability to consistently and reliably deliver measured droplets to a particular destination making it especially suitable to manufacture solder bumps. Either a single droplet 12 or a small multiple number of droplets 12 can be emitted to a particular location to form a solder bump as shown in FIG. 2.

Also shown in FIG. 2 are metal interconnect lines 52. Again because of the ability of droplet emitter 10 to deliver measured droplets in a variety of conceivable patterns, droplet emitter 10 is especially suited for this type of manufacturing.

Figure 3:
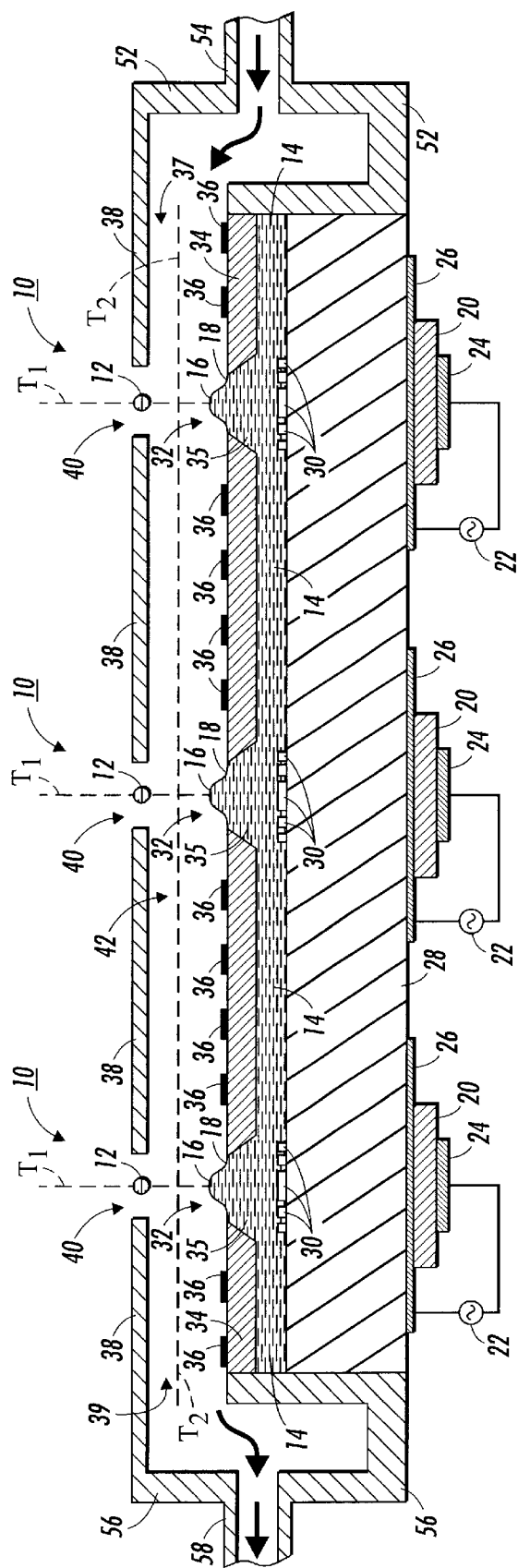
FIG. 3 shows a cross sectional view of a device which generates liquid droplets using focused acoustic energy according to the present invention and having multiple droplet generators.

Droplet emitter 10, shown in FIG. 1, contains a single assembly suitable for emitting a single droplet at a time. However, the assembly can be extended to supply an array of droplet emitters 10 as shown in FIG. 3. While FIG. 3 shows a one dimensional array of three droplet emitters 10, this is for illustrative purposes only, the array can contain many more droplet emitters 10 and may also be configured as a two dimensional array. As the individual droplet emitters are constructed and operated identically to the droplet emitter 10, shown in FIG. 1, attention will be focused on the new portions of FIG. 3. Components identical to those shown in FIG. 1 will be given the same reference numerals.

FIG. 3 shows an array of three droplet emitters 10. Each droplet emitter 10 is operated as shown and discussed with respect to FIGS. 1 and 2. However, by using an array of droplet emitters and independently controlling the firing of each emitter, economies of speed can be achieved when using the array to create three dimensional parts, solder bumps, circuit traces or items.

In addition to the array of droplet emitters 10, there is shown a gas inlet manifold 52 with its associated gas onlet tube 54 and a gas outlet manifold 56 with its associated gas outlet tube 58. The inert gas 42 flows into the gas inlet tube 54 and the gas inlet manifold 52. From there the inert gas 42 flows in the space created between the top gas containment plate 38 and the top fluid containment plate 34 along trajectory $T_2$. To maintain an inert gas 42 flow throughout the array a pressure differential between the gas inlet manifold 52 and the gas outlet manifold 56 must be maintained. A pressure differential of approximately 1 psi should be sufficient.

It should be noted that some inert gas 42 will bleed out through openings 40 in the top gas containment plate 38. However, sufficient gas should be supplied to maintain a constant inert gas 42 flow along trajectory $T_2$ and to insure that the space between the top gas containment plate 38 and the top fluid containment plate 34 is substantially filled with inert gas 42. As can be seen in FIG. 3, this results in an inert gas trajectory $T_2$ which is substantially parallel to the top fluid containment plate 34 at the free surface of the liquid 18 and substantially transverse, and possibly orthogonal to the droplet trajectory $T_1$.

What is claimed is:

1. A method for forming liquid metal droplets comprising the steps of:
   a) providing at least one pool of a molten metal, each pool of molten metal having an associated free surface,
   b) providing a continual flow of an inert gas across at least one free surface of at least one pool of molten metal, the continual flow substantially having a gas flow direction at each free surface of each pool,
   c) generating ultrasonic acoustic waves with at least one ultrasonic transducer adjacent to at least one pool of molten metal,
   d) focussing the generated ultrasonic acoustic waves to converge near at least one free surface of at least one pool of molten metal to emit drops of liquid metal through the continual flow of inert gas using at least one acoustic lens positioned adjacent to the at least one ultrasonic transducer, the emitted drops being emitted in a direction which is substantially transverse to the gas flow direction.

2. The method for forming liquid metal droplets of claim 1 wherein the emitted droplets are emitted in a direction which is substantially orthogonal to the gas flow direction.

3. The method for forming liquid metal droplets of claim 1 further comprising the step of successively depositing the emitted droplets of liquid metal onto a substrate to form a solid structure.

4. The method for forming liquid metal droplets of claim 3 wherein the continual flow of inert gas across the free surface also comprises bleeding gas outward from the free surface.

5. The method for forming liquid metal droplets of claim 4 wherein the space between the free surface and the substrate are substantially filled with the inert gas.

6. The method for forming liquid metal droplets of claim 1 wherein the continual flow of inert gas is at approximately 0.5 m/sec or less.

7. A method for forming liquid metal droplets comprising the steps of:
   a) providing at least two separated pools of liquid metal, each pool having a free surface,
   b) providing a single continual flow of inert gas across the free surfaces of the at least two separated pools of liquid metal, the continual flow substantially having a gas flow direction at the free surface of each pool,
   c) generating ultrasonic acoustic waves in at least one pool with at least one ultrasonic transducer associated with the at least one pool,
   d) focussing the generated ultrasonic waves to converge near the free surface of the at least one pool to emit drops of liquid metal through the continual flow of inert gas using at least one acoustic lens positioned adjacent to the at least one ultrasonic transducer, the emitted drops being emitted in a direction which is substantially transverse to the gas flow direction.

8. The method for forming liquid metal droplets of claim 7 wherein the emitted liquid metal droplets are emitted in a direction which is substantially orthogonal to the gas flow direction.

9. The method for forming liquid metal droplets of claim 7 further comprising the step of successively depositing the emitted droplets of liquid metal onto a substrate to form a solid structure.

10. The method for forming liquid metal droplets of claim 9 wherein the continual flow of inert gas across the free surface also comprises bleeding gas outward from the free surface.

11. The method of forming liquid metal droplets of claim 10 wherein the space between the free surface and the substrate are substantially filled with the inert gas.

12. The method for forming liquid metal droplets of claim 7 wherein the continual flow of inert gas is at approximately 0.5 m/sec or less.

* * * * *